United States Patent [19]

Herbst et al.

[11] 4,353,084
[45] Oct. 5, 1982

[54] READOUT CIRCUIT FOR A MONOLITHICALLY INTEGRATED CIRCUIT FOR LINEAR IMAGE SCANNING

[75] Inventors: Heiner Herbst; Matthias Niemeyer, both of Munich, Fed. Rep. of Germany

[73] Assignee: Siemens Aktiengesellschaft, Berlin & Munich, Fed. Rep. of Germany

[21] Appl. No.: 171,718

[22] Filed: Jul. 24, 1980

[30] Foreign Application Priority Data

Sep. 28, 1979 [DE] Fed. Rep. of Germany ....... 2939518

[51] Int. Cl.³ .............................................. H01L 27/14
[52] U.S. Cl. ......................................... 357/30; 357/24
[58] Field of Search ............................. 357/30, 24 LR

[56] References Cited

U.S. PATENT DOCUMENTS 4,242,599 12/1980 Suzuki ................................ 357/24 X
4,242,694 12/1980 Koike et al. ..................... 357/300 R

FOREIGN PATENT DOCUMENTS 2939518 5/1980 Fed. Rep. of Germany .

OTHER PUBLICATIONS

D. T. Wright, "Solid State Sensors:The Use of a Single Dimension 512 Element Array for Film Scanning", BBC Report RD1973/32, (PH-113), Nov., 1973, pp. 1-17.
J. M. White and S. G. Chamberlain, "A Multiple-Gate CCD-Photodiode Sensor Element for Imaging Arrays", *IEEE Transactions on Electron Devices,* vol. ED-25, No. 2, Feb., (1978), pp. 125-131.

*Primary Examiner*—Martin H. Edlow
*Assistant Examiner*—J. Carroll
*Attorney, Agent, or Firm*—Hill, Van Santen, Steadman, Chiara & Simpson

[57] ABSTRACT

A monolithically integrated circuit for linear image scanning is coupled through clock pulse-supplied transfer gates to a number of readout charge transfer devices and has an overflow drain zone and an overflow gate disposed between the drain zone and the sensors connected to a clock pulse for selectively permitting transfer of charge between the sensors and the drain zone, with the sensors divided into groups representing image lines. The linear image scanning circuit operated by the interlacing method by which partial images are generated by different groups of sensors. The clock pulse controlling the overflow gate restricts the integration times of the various groups of sensors so that during the scanning of the partial images generated thereby, overlapping of the image data of one line of adjacent partial images is eliminated.

4 Claims, 7 Drawing Figures

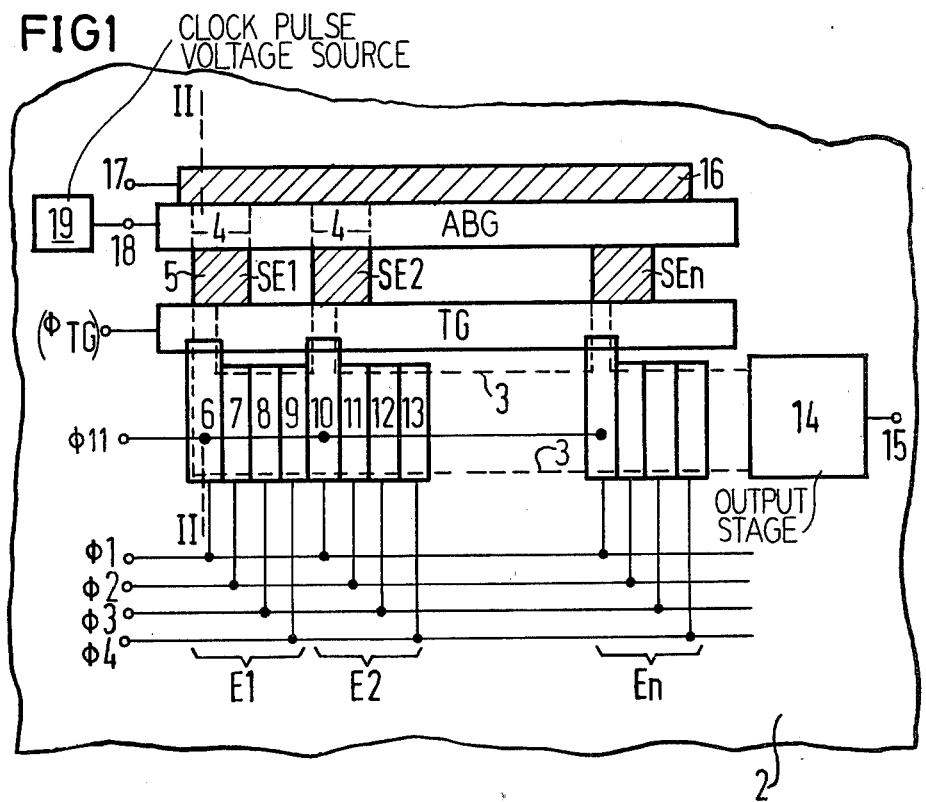
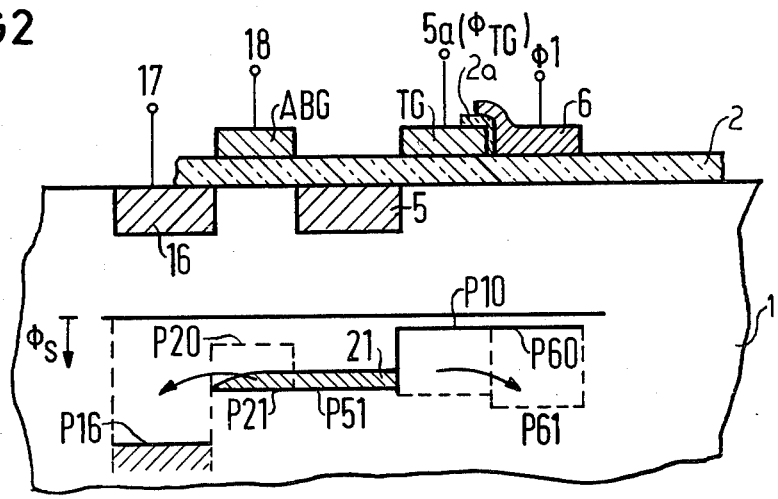

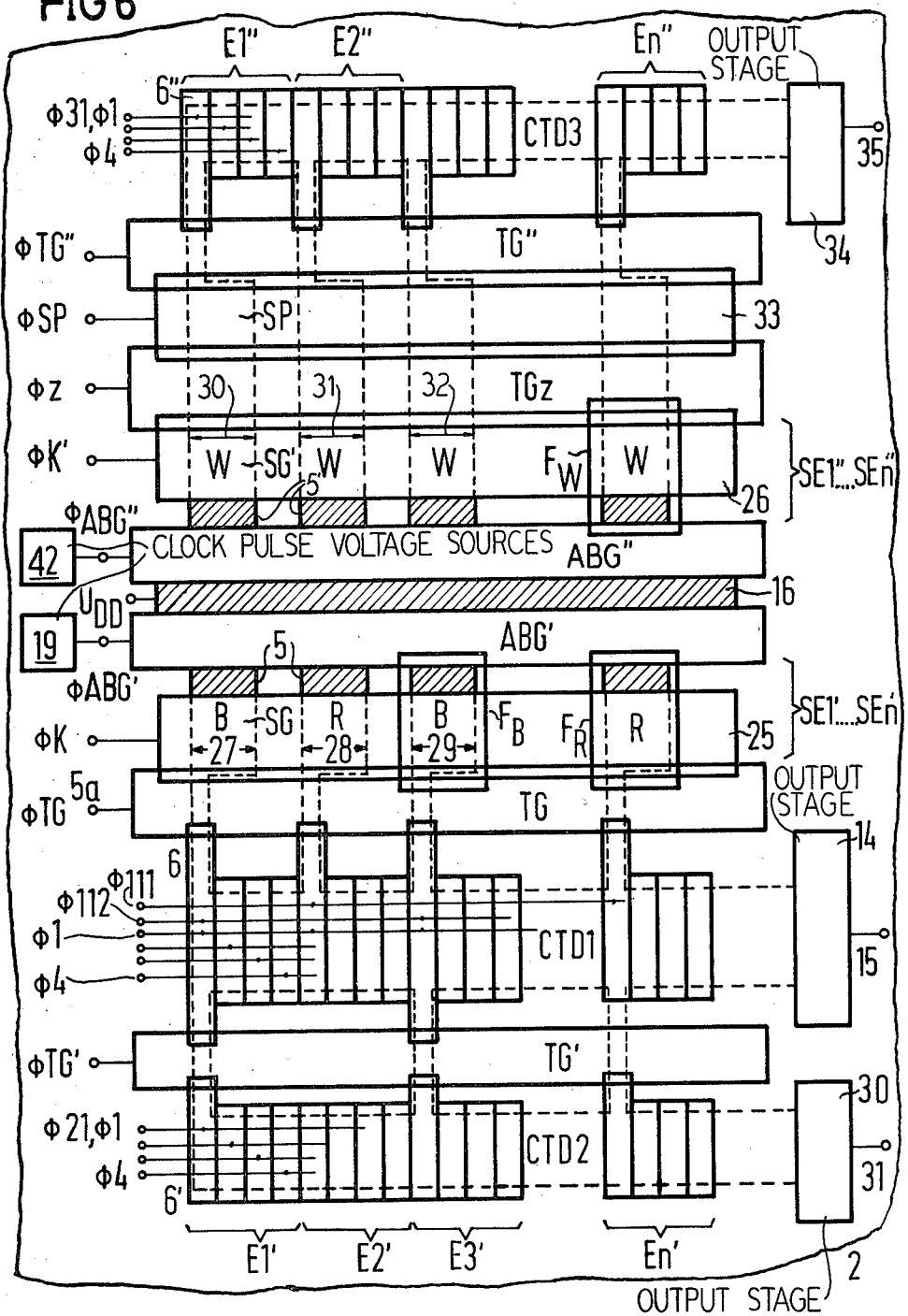

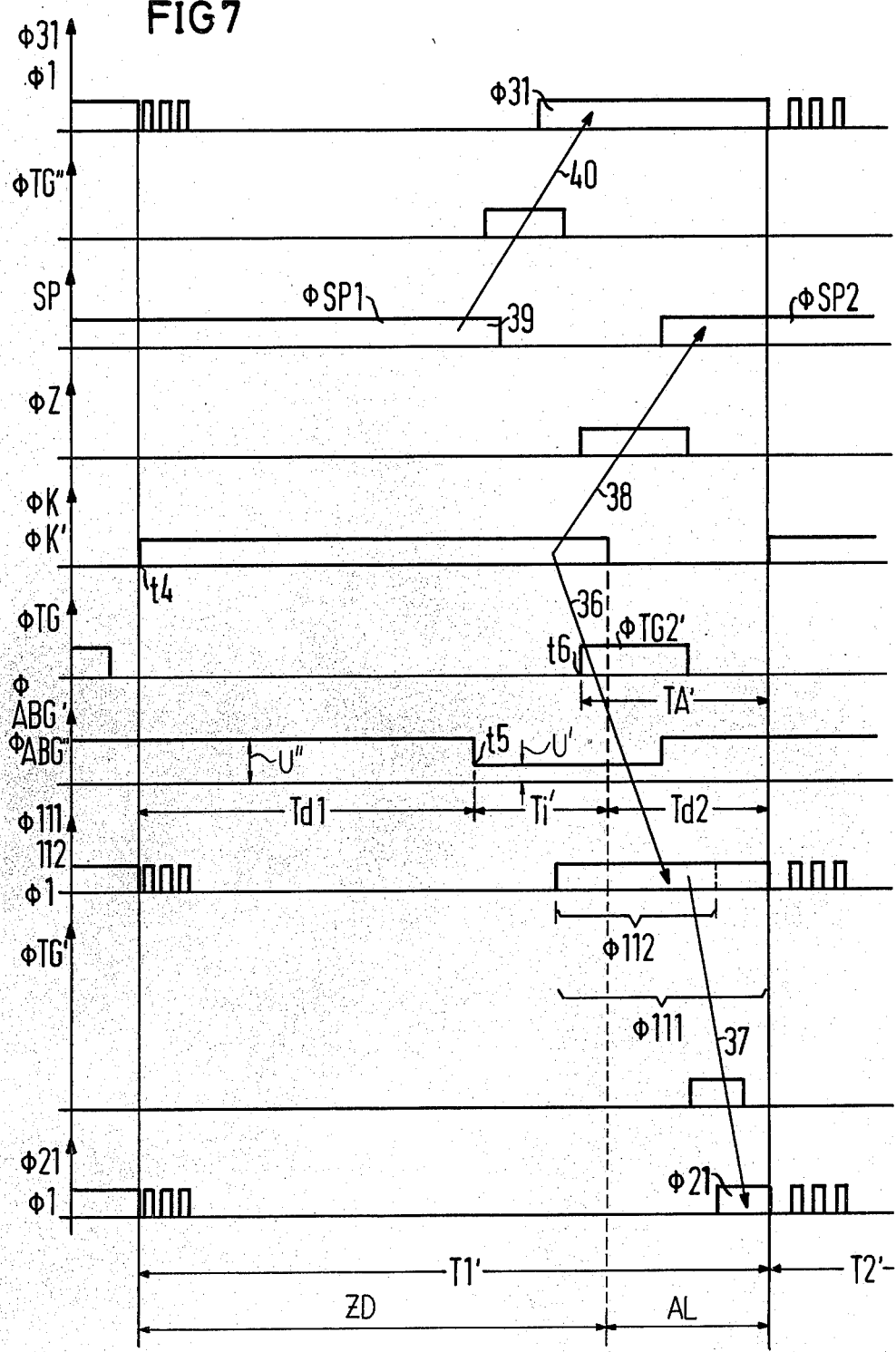

READOUT CIRCUIT FOR A MONOLITHICALLY INTEGRATED CIRCUIT FOR LINEAR IMAGE SCANNING

BACKGROUND OF THE INVENTION

1. Field of the Invention

The present invention relates to monolithically integrated linear image scanning circuits, and in particular to a circuit for readout of data therefrom.

2. Description of the Prior Art

A monolithically integrated circuit for linear image scanning having a linear image sensor with two parallel rows of opto-electronic sensor elements is known from "IEEE Transactions on Electron Devices," Vol. ED-25, No. 2, February, 1978 at pages 125 through 131. As disclosed therein, the sensor elements in one of the rows comprise a first group which are disposed behind a color filter of a first type and the sensor elements in the other row comprise a second group which are disposed behind color filters of a second type. An array having a linear image sensor for scanning the images of a continuously moving 8 mm film, which supplies a television signal containing the information, is disclosed in BBC Report RD 1973/32 (PH-113) "Solid State Sensors: The Use of a Single Dimension 512 Element Array for Film Scanning," pages 1 through 17, published in November, 1973 by the British Broadcasting Corporation.

A known method of image scanning consists of initially scanning only a portion of the lines of an image, for example, the odd-numbered lines, which together generate a first partial or fractional image. During an image reproduction, this first partial image is supplemented by additional partial images which may be comprised, for example, of the even-numbered image lines, thereby forming a complete image. Such a method, which is customarily employed in image reproduction in television installations, is known as interlacing.

In known circuits utilizing the interlacing method, the individually successive integration times during which optically generated charges are formed in the sensor elements as a result of radiation incident thereon (data information) are controlled by a clock pulse voltage which may be connected either to a transfer gate disposed between the sensor element and a readout device or directly to the sensor element. The integration times virtually border one another, that is, the ending of one integration time essentially coincides with the beginning of the successive integration time. As a result, during a scanning operation by the interlacing procedure, the generated sensor signals do not precisely correspond to the image data of the groups of sensors such as the odd-numbered lines, but rather correspond to overlapping portions of the sensor lines, such as the first sensor and a portion of the second line, the third sensor and a portion of the fourth line and so forth. Due to the undesired components of the intermediate lines, which undesired components are unavoidably contained in the desired line signals in known arrangements, the resolution of the complete image generated by the number of partial images, is considerably impaired in the vertical direction.

Related Application

This application is related to an application of the same inventors entitled "Monolithically Integrated Circuit for Linear Image Scanning with Matchable Sensors" filed simultaneously with the present application and now U.S. Pat. No. 4,334,239.

SUMMARY OF THE INVENTION

It is an object of the present invention to provide a monolithically integrated linear image scanning circuit and a method for operating same which permit scanning of partial images without overlapping thereof.

It is a further object of the present invention to provide such an apparatus and method for use in film scanners and television image scanners.

The above objects are inventively achieved in a linear image scanning circuit having controlled integration times. The control of the integration times of the sensors corresponding to image lines is undertaken by an overflow drain zone and an overflow gate disposed above the semiconductor between the sensors and the drain zone. The overflow gate is supplied with a clock pulse voltage which alternates between voltage levels which generate potentials in the semiconductor therebeneath which alternately permit and block transfer of charge from the sensors to the overflow drain zone. Each integration time, which corresponds to the period during which the clock pulse supplied to the overflow gate permits charge transfer between the sensor and the drain zone, is followed by a period during which charge transfer between the sensor and the drain zone is blocked, thereby preventing overlapping of successive integration periods as a result of charge from the previous integration period still being present at the time that the successive integration period begins.

DESCRIPTION OF THE DRAWINGS

FIG. 1 is a schematic circuit diagram of a monolithically integrated circuit for linear image scanning utilizing photodiodes constructed in accordance with the principles of the present invention.

FIG. 2 is a sectional view taken along line II—II of FIG. 1.

FIG. 6 is a schematic circuit diagram of a third embodiment of the linear image scanning circuit of FIG. 1 having three filtered sensor groups.

FIG. 7 is a voltage/time diagram for the clock pulse voltages for the operation of the circuit shown in FIG. 6.

DESCRIPTION OF THE PREFERRED EMBODIMENTS

Figure 3:
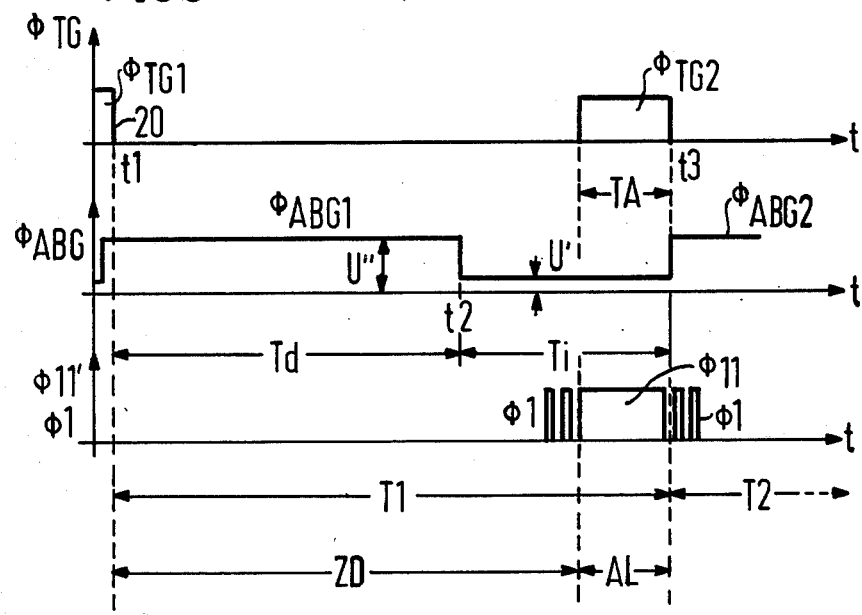
FIG. 3 is a voltage/time diagram for the clock pulse voltages for operation of the circuit shown in FIG. 1.

A circuit for linear image scanning is shown in plan schematic view in FIG. 1 and in sectional view in FIG. 2. The circuit is monolithically integrated on a semiconductor substrate 1 which is covered with an electrically insulating layer 2. The semiconductor substrate 1 may consist, for example, of p-conductive silicon and the insulating layer 2 may consist, for example, of silicon dioxide. The insulating layer 2 has thin film zones which are disposed within the dashed lines 3 and 4 and has thick film zones beyond those lines. If a silicon dioxide layer is used, the areas between the dashed lines 3 and 4 are designated as gate oxide zones and the areas beyond those lines are field oxide zones.

The circuit has a plurality of sensor elements SE1 through SEn which in FIGS. 1 and 2 consist of photodiodes and are formed by oppositely doped n-conductive zones 5 disposed at the boundary surface of the semiconductor substrate 1. The light-sensitive portion of the circuit, that is the sensors designated by the zones 5, is bounded by apertures in a metal film layer covering the entire remaining arrangement.

Next to the row of sensor elements SE1 through SEn, a transfer gate TG is disposed which is separated from the boundary surface of the semiconductor substrate 1 by the insulating layer 2 and which is connected through a terminal to a clock pulse voltage $\phi_{TG}$. Adjacent to the transfer gate TG are the transfer electrodes of a readout charge transfer device arrangement which operates in four-phase mode. Those electrodes cover the charge transfer device transfer channel which is laterally bounded by the dashed lines 3. The transfer electrodes referenced at 6, 7, 8 and 9 are respectively connected at their terminals with clock pulse voltages $\phi_1$, $\phi_2$, $\phi_3$ and $\phi_4$ and form a charge transfer device transfer stage E1. The succeeding transfer electrodes 10, 11, 12 and 13 form the transfer stage E2 and it will be understood that the charge transfer device has further identical transfer stages which are not shown in detail in FIG. 1 which are also connected to the phases $\phi_1$ through $\phi_4$. At the last transfer stage En is connected a charge transfer device output stage 14 of the type known to those skilled in the art which is provided with an output terminal 15. One transfer electrode in each transfer stage, such as electrodes 6 and 10, slightly overlap the marginal zones of the transfer gate TG and are separated from the gate TG by an intermediate insulating layer 2a.

At the side of the sensor elements SE1 through SEn away from the gate TG is disposed an overflow gate ABG which is also separated from the boundary surface of the semiconductor substrate 1 by the insulating layer 2. Next to the gate ABG is disposed an oppositely doped overflow drain zone 16 which in the present example is an n-conductive zone disposed at the boundary surface of the substrate 1. The overflow gate ABG is connected at a terminal 18 with a clock pulse voltage source 19 and the overflow drain zone 16 is connected at a terminal 17 to a constant supply voltage $U_{DD}$.

Operation of the circuit shown in FIGS. 1 and 2 will be described in conjunction with the voltage/time diagram of FIG. 3 and the surface potential diagram for the substrate 1 shown in FIG. 2.

An integration cycle T1 begins with the trailing edge 20 of a clock pulse $\phi_{TG1}$ supplied to the transfer gate TG. The sensor elements SE1 through SEn are thereby separated from the inputs of the associated transfer stages E1 through En by a potential threshold P10. As a result of a previously connected clock pulse $\phi_{ABG1}$ having an amplitude U″ which is connected to the transfer gate ABG, a potential value P21 will exist beneath the overflow gate ABG which is greater than or equal to the potential P51 at which the zone 5 lies at the commencement of the integration cycle T1. In FIG. 2 the potential profile which is present at the beginning of the integration cycle T1 at approximately the time t1 is represented by the solid line referenced as $\phi_s$. As long as the high potential value P21 exists, the optically generated charges indicated at 21 in FIG. 2 can flow into the overflow zone 16. At a time t2 which coincides with the occurrence of the trailing edge of the pulse $\phi_{ABG1}$, the potential barrier P20 occurs beneath the overflow gate ABG which corresponds to a lower pulse amplitude U′ supplied by the clock pulse voltage source 19. The amplitude U′ is selected so that only the excessive charge carriers 21 occurring as a result of excessively strong exposure of the sensor element reach the zone 16 through the barrier P20. Such carriers would otherwise penetrate adjacent sensor elements and falsify the image data.

At the time t2, the integration time Ti of the sensor elements SE1 through SEn begins during which optically generated charge carriers are collected in the zone 5. Upon the occurrence of a clock pulse $\phi_{TG2}$, the time span TA commences for the readout of the collected charge 21 into the potential well P61 which is formed by a pulse $\phi_{11}$ supplied to the extended transfer electrodes such as electrodes 6 and 10. The integration time Ti encompasses this readout. Upon the occurrence of the trailing edge of the pulse $\phi_{TG2}$ at the time t3 the readout time TA and the integration time Ti terminate and a new integration cycle T2 simultaneously commences. After the time t3 the clock pulse voltages $\phi_1$ through $\phi_4$ are connected, as indicated in FIG. 3 by the several pulses $\phi_1$. The charge packets 21 which were read out from the sensors SE1 through SEn and which represent the image data of an entire image line are then sequentially supplied to the output stage 14 through the transfer channel of the charge transfer device. The output stage 14 derives in a known manner a line signal which occurs at the output terminal 15.

The clock pulse voltage source 19, which alternates between the amplitudes U″ and U′ effects in the time period t1 to t2 a flow of the optically generated charge carriers 21 from the sensor elements SE1 through SEn beneath the overflow gate ABG and, in the time period t2 through t3, effects a so-called "anti-blooming" function of the gate ABG. The integration time Ti represents only a partial section of the integration cycle T1 so that a following portion Td exists between two successive integration times Ti. In the case of continuous movement of an image to be scanned there is thus present between two successively analyzed image lines a constant interval determined by the length of the equal pulses $\phi_{ABG1}$, $\phi_{ABG2}$ and further sequential pulses.

Figure 4:
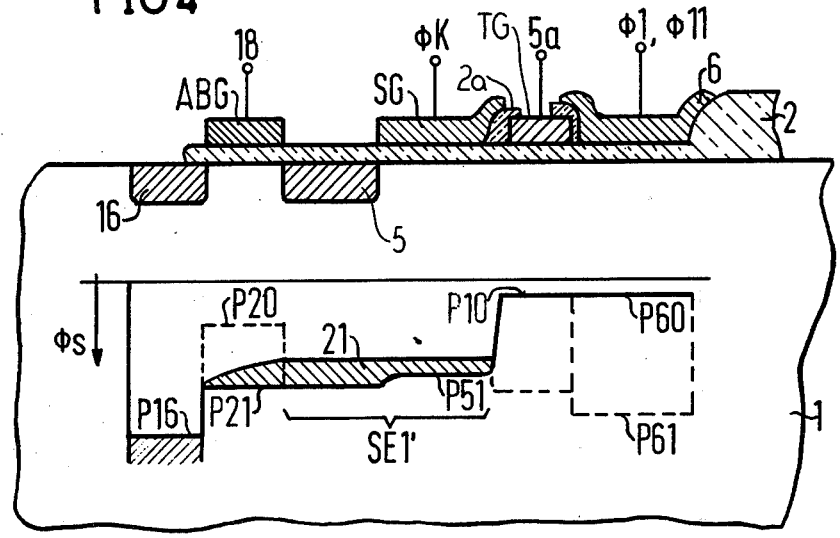
FIG. 4 is a sectional view of a second embodiment of the circuit of FIG. 1.

FIG. 4 is a sectional view of a second embodiment of the circuit shown in FIGS. 1 and 2 which differs only in the composition of the sensor elements. As shown therein, each sensor element consists of a photodiode region 5 and a metal-insulator-semiconductor capacitor formed by the substrate 1, the insulating layer 2, and an external electrode SG which has a terminal supplied with a clock pulse voltage $\phi_K$. Circuit elements common to FIGS. 2 and 4 are otherwise identically referenced. The light-sensitive zone which is determined by the apertures in the opaque film layer covering the remaining parts of the circuit includes the zone 5 and may include the semiconductor zones covered by the electrodes SG in which case those electrodes will be transparent.

Figure 5:
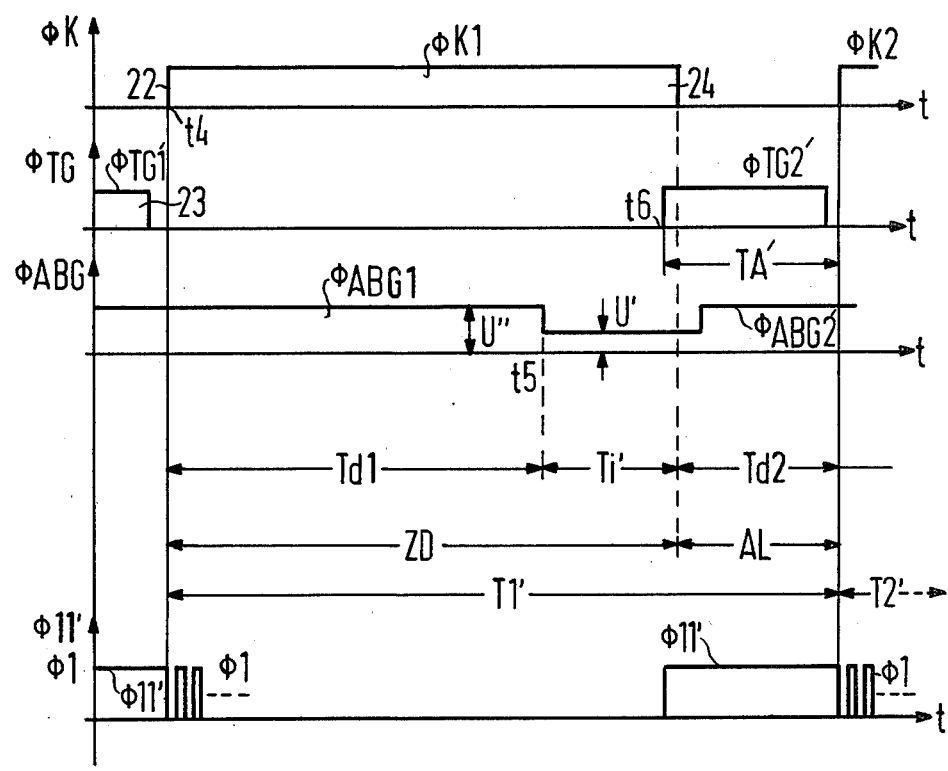
FIG. 5 is a voltage/time diagram for the clock pulse voltages for the operation of the circuit shown in FIG. 4.

The operation of the embodiment shown in FIG. 4 is explained by the voltage/time diagram of FIG. 5 wherein an integration cycle T1′ begins with the leading edge 22 of a clock pulse $\phi_{K1}$ occurring at a time t4. The potential profile $\phi_s$ at this time beneath the various circuit components is shown in the solid line in the substrate in FIG. 4. Upon the occurrence of the trailing edge 23 of the clock pulse $\phi_{TG1'}$, the sensor elements were separated from the inputs of the charge transfer device arrangement beneath the transfer electrodes 6 and 10 by the potential threshold P10. The clock pulse $\phi_{ABG1'}$ having an amplitude U" generates the potential P21 beneath the gate ABG which is greater than the potential P51 of the zone 5 of the sensor element SE1' beneath the electrode SG. Optically generated charges flow off to the zone 16. At a time t5 which coincides with the occurrence of the trailing edge of the pulse $\phi_{ABG1'}$ the potential barrier P20 results corresponding to the voltage value U'. The integration time Ti' thus begins at the time t5. Upon the occurrence of the clock pulse $\phi_{TG2'}$ there begins at time t6 the time span TA' for the readout of the collected charge packets 21 into the potential well P61 which is formed beneath the extended electrodes such as electrode 6 by the supply of a clock pulse $\phi11'$ thereto. The integration time Ti' is terminated by the trailing edge 24 of the pulse $\phi K1$.

Following the occurrence of a new clock pulse $\phi_{ABG2'}$ and at the end of the pulse $\phi_{TG2'}$, or at the end of the readout time TA', a new integration cycle T2' commences with the next pulse $\phi K2$. At this time the clock pulse voltages $\phi 1$ through $\phi 4$ are connected as is shown in FIG. 5 which transfer the charge packets which have been generated to the output stage 14 of the charge transfer device. As also shown in FIG. 5, the integration time Ti' represents only a portion of the integration cycle T1' so that between two successive integration times Ti', two portions Td1 and Td2 are disposed. In the case of a continuous movement of an image to be scanned, a constant interval is present between two successively analyzed image lines.

Moreover, the embodiment shown in FIG. 4 may be further modified by omission of the zones 5 representing the photodiodes so that the sensor element SE1' is comprised solely of the metal-insulator-semiconductor capacitor having the external electrode SG. In this embodiment, the overflow gate ABG and the overflow drain zone 16 in FIG. 4 are shifted to the right so that the overflow gate ABG and the electrode SG are directly adjacent to each other. The operation of this circuit corresponds to the above-described operation for FIG. 4.

A further embodiment of the invention is shown in FIG. 6 wherein the linear image sensor contains two parallel rows of sensor elements SE1' through SEn' and SE1" through SEn". Each sensor element consists of an oppositely doped zone respectively referenced at 5 and 5' which represent a photodiode, and a metal-insulator-semiconductor capacitor. The capacitors for the sensor elements SE1' through SEn' are formed by those portions of an electrically conductive strip coating 25 disposed above thin film regions such as 27, 28 and 29 of the insulating layer 2. The capacitors for the sensors SE1" through SEn" are formed by an electrically conductive strip coating 26 disposed above thin film regions such as 30, 31 and 32 in the insulating layer 2. The strip 25 is connected at a terminal to the clock pulse voltage $\phi K$ and the strip 26 is connected at a terminal to the clock pulse voltage $\phi K'$.

The sensor elements SE1' through SEn' are divided into two groups with those in the first group referenced at B and those in the second group referenced at R in alternating fashion. All sensor elements in group B are covered with color filters of a first type one of which is shown in FIG. 6 referenced at $F_B$. All sensor elements in group R are covered with color filters of a second type, one of which is shown in FIG. 6 referenced at $F_R$. The color filters are alternatingly disposed above the strip 25.

All sensor elements SE1" through SEn" comprise a third sensor group W which are covered with color filters of a third type, one of which is referenced in FIG. 6 at $F_W$. The light-sensitive zones of the circuit shown in FIG. 6 which are determined by apertures in an opaque layer covering the remaining circuit elements include the zones 5 and may include as well the semiconductor zones covered by the external electrodes SG, in which case the electrodes SG are transparent.

The sensors SE1' through SEn' are disposed next to the transfer gate TG which is identical to that shown in FIG. 1 and which has a terminal 5a to which is supplied a clock pulse voltage $\phi_{TG}$. A charge transfer device CTD1, corresponding to the charge transfer device shown in FIG. 1 is disposed next to the transfer gate TG and has an extended electrode such as electrode 6 in each transfer stage thereof. The extended electrode extends above the marginal areas of the transfer gate TG as well as above marginal areas of a second transfer gate TG' which is supplied at a terminal with a clock pulse voltage $\phi_{TG'}$. In addition, a clock pulse voltage $\phi 111$ is supplied to those extended electrodes in CTD1 which are in registry with sensor elements in group R, and a clock pulse voltage $\phi 112$ is supplied to those extended electrodes in CTD1 in registry with sensor elements in group B.

A second charge transfer device CTD2 is disposed on the opposite side of the second transfer gate TG', which device CTD2 has a plurality of successive transfer stages E1', E2', E3' through En' each having four transfer electrodes respectively supplied with clock pulse voltages $\phi 1$ through $\phi 4$. One transfer electrode such as electrode 6' in each transfer stage in registry with a sensor in group B is extended above a marginal portion of the second transfer gate TG' and is separated therefrom by an intermediate insulating layer. Those extended electrodes are supplied with an additional clock voltage $\phi 21$. The charge transfer device CTD2 terminates in an output stage 30 of a type known to those skilled in the art which has an output terminal 31.

The overflow drain zone 16 is identical to that shown in FIG. 1 and is connected to a supply voltage $U_{DD}$. The overflow zone 16 is surrounded on one side by an overflow gate ABG' which is supplied with a clock pulse voltage $\phi_{ABG'}$ by the clock pulse voltage source 19 for transfer of charge from the regions 5 into the overflow drain zone 16. At its opposite side, the drain zone 16 is surrounded by a second overflow gate ABG" which is supplied with a clock pulse $\phi_{ABG''}$ from a clock pulse voltage source 42 for transfer of charge from the regions 5' to the overflow zone 16.

A third transfer gate TGz is disposed next to the strip 26 and slightly overlaps a marginal edge thereof and is supplied at a terminal with a clock pulse voltage $\phi_z$. The strip TGz also overlaps an electrically conducting strip 33 which is supplied at a terminal with a clock pulse voltage $\phi_{SP}$. Those portions of the strip 33 which cover thin film areas represented by the dashed lines form the external electrodes of memory capacitors and are referenced at SP. The gate TGz is separated from the strips 26 and 33 by intermediate insulating layers. A fourth transfer gate TG" is disposed next to the strip 33 and overlaps a marginal portion thereof and is separated therefrom by an intermediate insulating layer and is supplied with a clock pulse voltage $\phi_{TG''}$. A third readout charge transfer device CTD3 is arranged next to the fourth transfer gate TG" and has a plurality of successive transfer stages E1", E2" through En" covering the transfer channel thereof. Each transfer stage has four transfer electrodes therein respectively supplied with clock pulse voltages $\phi 1$ through $\phi 4$. One electrode such as 6″ in each transfer stage extends above a marginal portion of the gate TG″ and is additionally supplied with a clock pulse voltage $\phi 31$. The device CTD3 terminates in an output stage 34 of a type known to those skilled in the art which has an output terminal 35.

The color filters $F_B$ and $F_R$ exhibit different spectral sensitivity curves which may correspond, for example, to the primary colors blue and red whereas the color filters $F_W$ exhibit sensitivity curves which comprise approximately the entire spectral range of visible light, however, have a range of maximum sensitivity in the spectral range of the primary color green. The color filters $F_W$ may, however, have a sensitivity curve which lies only in the spectral range of the primary color green.

The operation of the circuit shown in FIG. 6 will be described in detail utilizing the voltage/time diagram shown in FIG. 7, which generally corresponds to that shown in FIG. 5. An integration cycle T1′ again begins at a time t4 with the occurrence of clock pulses $\phi K$ and $\phi K'$. Before the termination of the pulses $\phi K$ and $\phi K'$, at a time t5 the pulses $\phi_{ABG'}$ and $\phi_{ABG''}$ change in amplitude from U″ to U′ thereby blocking further transfer of charge from the regions 5 and 5′ into the overflow drain zone 16. The optically generated charge is then simultaneously transferred from the sensor elements SE1″ through SEn″, all in group W, into the memory capacitors SP which are supplied with a clock pulse $\phi_{SP2}$ for this purpose. The transfer is enabled by the occurrence of a pulse $\phi_{Tz}$ which overlaps the trailing edge of the pulse $\phi K$ and the leading edge of the pulse $\phi_{SP2}$. The transfer is referenced at arrow 38. Simultaneously, a transfer of the optically generated charge from the sensors SE1′ through SEn′, comprising the groups B and R are transferred beneath the extended electrodes of the device CTD1 by the occurrence of a pulse $\phi_{TG2'}$ beginning at time t6 supplied to the gate TG. During this transfer the extended electrodes such as electrodes 6 in CTD1 are alternatingly supplied with clock pulse voltages $\phi 112$ and $\phi 111$. The duration of $\phi 112$ is shorter than that of $\phi 111$ so that upon the occurrence of a pulse supplied to the gate TG′, transfer of charge from those electrodes in registry with the sensors of group B occurs into the second charge transfer device CTD2, which has extended electrodes supplied with the clock pulse voltage $\phi 21$ for this purpose. Charge transfer in CTD1 and CTD2 then occurs by the application of clock pulse voltages $\phi 1$ through $\phi 4$ in a known manner.

Previously, those charge packets from the sensors in group W from the preceding integration period, which were retained in the memory capacitors SP by the application of a pulse $\phi_{SP1}$ are transferred upon the occurrence of the trailing edge 34 of that pulse into the third readout device CTD3 by the occurrence of a pulse applied to the gate TG″ and a pulse $\phi 31$ supplied to the extended electrodes such as electrode 6″ of CTD3. This transfer is represented by the arrow 40 in FIG. 7. Upon arrival in the device CTD3, the charge packets are transferred therein by the successive application of clock pulses $\phi 1$ through $\phi 4$ in a manner known to the art to the output stage 34.

During the preceding integration cycle, not illustrated in FIG. 7, a specific image line of a color image to be scanned was aligned or oriented to the row of sensor elements SE1″ through SEn″, those in group W, whereby from the latter image line the signals from the sensors in group W were derived and intermediately stored in the storage capacitors SP. During the succeeding integration cycle T1′, illustrated in FIG. 7, as a consequence of the continuous movement of the color image to be scanned, the same line is then aligned to the row of sensor elements SE1′ through SEn′, whereby from the latter line sensor signals from sensors in groups B and R are derived and read out into the devices CTD1 and CTD2. Simultaneously, the intermediately stored sensor signals from group W are also read out from the memories SP into the device CTD3. At the commencement of the integration cycle T2′, the clock pulse voltages $\phi 1$ through $\phi 4$ are connected which separately supply the signals from the sensors in groups W, R and B in the form of charge packets to the output stages 34, 14 and 30. At the output stages, voltage signals corresponding to each group are then derived which are available at the terminals 35, 15 and 30. From these voltage signals, so-called color value signals can be derived which control the brightnesses of the primary colors in a color television picture tube.

As further shown in the circuit of FIG. 7, the integration time Ti′ is only a partial section of every integration cycle T1, so that between two successive integration times Ti′, constant time sections Td1 and Td2 are interposed, which guarantee a constant interval between two successively analyzed image lines of the color image to be scanned.

In the embodiments discussed above, it has been assumed that the semiconductor substrate 1 is of a p-conductive type and the indicated voltage potentials exhibit positive polarity signs compared with the reference potential of the circuit at which the semiconductor substrate 1 lies. If the conductivity types of the semiconductor zones are replaced by types of opposite conductivity, it will be understood that the inventive concept herein can be practiced with voltages of correspondingly reversed polarity.

Although the charge transfer devices in the embodiments shown above were designed as surface charge coupled devices (SCCD) the inventive concept disclosed herein can be realized with any known charge transfer device arrangement such as are described, for example, in the text by Sequin and Tompsett entitled: "Charge Transfer Devices, " Academic Press, New York, 1975 at pages 1 through 18. Such charge transfer device arrangements may, depending upon individual needs, function in, for example, two-, three-, four- or multi-phase operation.

The periods referenced at ZD in FIGS. 3, 5 and 7 correspond to the line duration in a reproduction device utilizing a scanning electron beam. This is the time span in which the sensor signals, corresponding to an image line, are emitted at the outputs 15, 31 and 35 under the influence of the clock pulse voltages $\phi 1$ through $\phi 4$. The period ZD is preferably selected to correspond to the time span which the electron beam of the image display device requires in order to write one image line. Within a line duration ZD, the line signal, obtained in the immediately preceding integration cycle, is read out from the inventive circuit. The period AL, disposed between two periods ZD, is known as the blanking interval. In this period the electron beam writing the line signal in a reproduction device is blanked and conveyed from the line end to the line beginning of the next line. In the case of a reproduction in standard television apparatus, the period ZD is 52 microseconds and the period AL is 12 microseconds.

Although modifications and changes may be suggested by those skilled in the art, it is the intention of the inventors to embody within the patent warranted hereon, all modifications and changes as reasonably and properly come within the scope of their contribution to the art.

We claim as our invention:

1. A monolithically integrated circuit for linear image scanning disposed on a semiconductor substrate comprising:
   a first row of opto-electronic sensor elements;
   a first type of color filter covering each of said sensor elements in said first row;
   a first charge transfer device coupled to said opto-electronic sensor elements in said first row for readout thereof;
   a second row of opto-electronic sensor elements;
   second and third types of color filters alternately covering said sensor elements in said second row, said first, second and third types of color filters having respectively different spectral ranges;
   an overflow drain zone disposed at a boundary surface of said semiconductor substrate and having an opposite conductivity with respect thereto,
   said first and second rows of sensor elements being parallel and said overflow drain zone being parallelly disposed between said first and second rows;
   a first overflow gate disposed between said first row of sensor elements and said overflow drain zone;
   a second overflow gate disposed between said second row of sensor elements and said drain zone; and
   a clock pulse voltage source connected to said first and second overflow gates for supplying respective pulses to said first and second overflow gates which alternate between a lower voltage value for blocking flow of charge from said sensor elements into said overflow drain zone and an upper voltage value for permitting flow of charge from said sensor elements into said overflow drain zone,
   whereby said sensor elements in said first and second rows are cyclically scanned and emptied and said lower voltage value prevents overlapping of charge between successive scanning cycles.

2. The circuit of claim 1 wherein said opto-electronic sensor elements are comprised of photodiodes.

3. The circuit of claim 1 wherein said opto-electronic sensor elements are comprised of metal-insulator-semiconductor capacitors.

4. The circuit of claim 1 wherein said opto-electronic sensor elements are each comprised of a metal-insulator-semiconductor capacitor and a photodiode disposed adjacent to each other.

* * * * *